United States Patent [19]

Tarbouriech

[11] Patent Number: 5,532,899
[45] Date of Patent: Jul. 2, 1996

[54] VOLTAGE PROTECTION STRUCTURE FOR SEMICONDUCTOR DEVICES

[75] Inventor: Jean-Claude Tarbouriech, Ville-la-Grand, France

[73] Assignee: Motorola, Inc., Schaumburg, Ill.

[21] Appl. No.: 210,865

[22] Filed: Mar. 21, 1994

[30] Foreign Application Priority Data

Apr. 13, 1993 [GB] United Kingdom ............ 9307538

[51] Int. Cl.$^6$ .................................................. H01L 23/58
[52] U.S. Cl. ...................... 361/126; 257/355; 257/487; 257/496; 257/618; 257/730
[58] Field of Search ........................... 257/355–356, 257/360–362, 730, 683, 693, 787, 177, 487, 496, 618; 361/118, 126–128

[56] References Cited

FOREIGN PATENT DOCUMENTS 0925039  8/1961  United Kingdom.
1531811  1/1976  United Kingdom.

*Primary Examiner*—Jeffrey A. Gaffin
*Assistant Examiner*—Michael J. Sherry

[57] ABSTRACT

A voltage protection arrangement (10) comprises a semiconductor substrate (12) having at least two electrical conductors (16,18,20) adjacent an edge of the substrate. An aperture (22) extends from the edge towards a point between the two electrical conductors. The aperture (22) reduces conductance between the two electrical conductors (16,18) in a region adjacent the edge of the substrate (12), such that if an excess voltage occurs between the two conductors (16,18), a reduced current flows in the region.

8 Claims, 1 Drawing Sheet

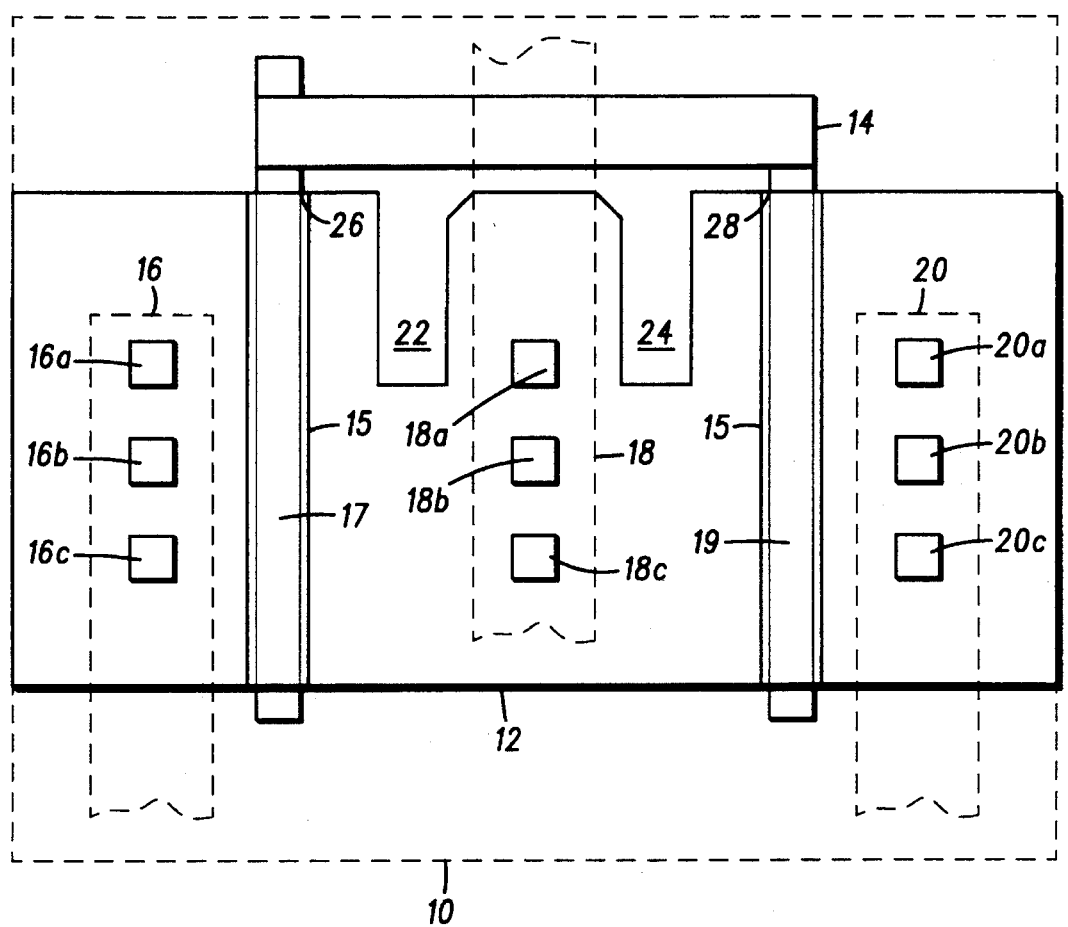

VOLTAGE PROTECTION STRUCTURE FOR SEMICONDUCTOR DEVICES

FIELD OF THE INVENTION

This invention relates to voltage protection arrangements.

BACKGROUND OF THE INVENTION

Transistors are prone to damage from electrostatic discharges (ESD's).

A transistor electrode is typically connected via a series of contacts to a semiconductor substrate. In the event of an ESD, the excess current may discharge through the substrate via the series of contacts. A contact of the series nearest the edge of the substrate may draw a larger current than the other contacts in the series because at the edge there is a greater surface area through which current may flow. This excessive current flow may damage the contact nearest the edge of the substrate. A further problem is that typically at the edge an inherently weak insulation exists between a polycrystalline gate of the transistor and the substrate. ESD's have been known to result in a short circuit therebetween.

This invention seeks to provide a voltage protection arrangement in which the above mentioned disadvantages have been mitigated.

SUMMARY OF THE INVENTION

A voltage protection arrangement comprises a semiconductor substrate having at least two electrical conductors adjacent an edge of the substrate. An aperture extends from the edge towards a point between the two electrical conductors. The aperture reduces conductance between the two electrical conductors in a region adjacent the edge of the substrate, such that if an excess voltage occurs between the two conductors, a reduced current flows in the region.

The semiconductor substrate may comprise diffused silicon.

The two electrical conductors may comprise a series of metal contacts formed at the surface of the substrate.

A polycrystalline transistor gate structure may be attached to the substrate via an oxide insulating layer, the gate structure extending to the edge of the substrate between the aperture and one of the two conductors. In this way, if an excess voltage occurs between the two conductors, the oxide material is less susceptible to a short circuit occurring between the gate structure and the substrate because of the aperture.

The voltage protection arrangement may be incorporated in a transistor device.

In this way uneven current flow is reduced from the contact nearest the edge of the substrate, which also reduces likelihood of a short circuit occurring between the polycrystalline gate structure and the substrate.

BRIEF DESCRIPTION OF THE DRAWING

An exemplary embodiment of the invention will now be described with reference to the drawing in which:

The FIGURE shows a preferred embodiment of a voltage protection arrangement in accordance with the invention.

DETAILED DESCRIPTION OF A PREFERRED EMBODIMENT

Referring to the FIGURE, there is shown a voltage protection arrangement 10 incorporated in a transistor of an integrated circuit (IC). A doped semiconductor substrate 12 of the IC has formed at its surface a first series of contacts 16a, 16b, 16c, to a first metallised current conduction path 16, a second series of contacts 18a, 18b, 18c, to a second metallised current conduction path 18 and a third series of contacts 20a, 20b, 20c to a third metallised current conduction path 20. The conduction paths form external connections for the IC, between which an ESD would appear.

A polycrystalline silicon gate structure 14 of the transistor is formed on the substrate 12. A layer of an oxide insulating material 15, between the substrate 12 and the gate structure 14 provides insulation therebetween. A first arm 17 of the gate structure 14 extends across the substrate 12 between the first conductor 16 and the second conductor 18. A second arm 19 of the gate structure 14 extends across the substrate 12 between the second conductor 18 and the third conductor 20.

It has been found that the structure 14 has an inherently fragile point 26 on the arm 17 and a similar fragile point 28 on the arm 19, where the oxide material 15 insulation between the arms 17 and 18 and the substrate 12 may be poor.

A first notch or aperture 22 is cut out from the edge of the nitride substrate 12, extending perpendicularly from the edge towards a point between the first arm 17 of the structure 14 and the contact 18a of the second conductor 18.

Similarly a second aperture 24 is cut out from the edge of the nitride substrate 12, extending perpendicularly from the edge towards a point between the second arm 19 of the structure 14 and the contact 18a of the second conductor 18.

Any ESD in the conductors may cause current to flow between the conductor 18 and one or both of the conductors 16 and 20 through the substrate 12. At a region of the substrate adjacent the edge, there is a greater area through which the ESD current may flow, but the apertures 22 and 24 reduce the area for conduction in this region, preventing excessive current flow through the contact 18a, which is the contact closest to the edge of the substrate 12. This reduces the likelihood of possible damage to the contact 18a.

Additionally, a higher resistance path now exists between the contact 18a and the fragile points 26 and 28 of the gate structure 14 at the edge of the substrate 12. Therefore the points 26 and 28 are subjected to a lower potential during an ESD, and thus are less susceptible to a breakdown of the oxide material causing a short circuit between the gate structure 14 and the substrate 12.

It will be appreciated that alternative arrangements to the one described above may be used. For example, alternative semiconductor material could be used for the substrate instead of silicon, such as gallium arsenide.

Additionally, it will be appreciated that a single aperture or notch could be used in an arrangement having two conductors. Similarly, more than two apertures or notches could be used in an arrangement with many conductors.

I claim:

1. A voltage protection arrangement comprising:
   a semiconductor substrate having at least two discrete electrical conductors adjacent an edge of the substrate, and
   an aperture extending from said edge towards a point between the two electrical conductors, whereby the aperture reduces conductance between the two electrical conductors in a region adjacent the edge of the substrate, such that if an excess voltage occurs between the two conductors, a reduced current flows in the region.

2. The arrangement of claim 1 wherein the semiconductor substrate comprises diffused silicon.

3. The arrangement of claim 1 wherein the two electrical conductors comprise a series of metal contacts deposited in the substrate.

4. The arrangement of claim 1 further comprising a polycrystalline transistor gate structure formed over the substrate, wherein the polycrystalline transistor gate structure is insulated from the substrate by an oxide layer, the gate structure extending to the edge of the substrate between the aperture and one of the two conductors, such that if an excess voltage occurs between the two conductors, the oxide layer is less susceptible to a breakdown causing a short circuit between the gate structure and the substrate because of the aperture.

5. A transistor device comprising:

a semiconductor substrate; and at least two discrete electrical conductors formed over the semiconductor substrate, wherein the at least two discrete electrical conductors are adjacent an edge of the semiconductor substrate, and wherein the semiconductor substrate includes an aperture extending from the edge towards a point between the at least two discrete electrical conductors, whereby the aperture reduces conductance between the at least two electrical conductors in a region adjacent the edge such that when an excess voltage occurs between the at least two electrical conductors, a reduced current flows in the region adjacent the edge.

6. The device of claim 5 wherein the semiconductor substrate comprises diffused silicon.

7. The device of claim 5 wherein the at least two electrical conductors comprise a series of metal contacts deposited onto the substrate.

8. The device of claim 5 further comprising a polycrystalline transistor gate structure formed over the semiconductor substrate, wherein the polycrystalline transistor gate structure is insulated from the semiconductor substrate by an oxide layer, and wherein the gate structure extends to the edge of the semiconductor substrate between the aperture and one of the two conductors, such that if an excess voltage occurs between the two conductors, the oxide layer is less susceptible to a breakdown causing a short circuit between the gate structure and the semiconductor substrate because of the aperture.

* * * * *